(12) United States Patent
Song et al.

(10) Patent No.: US 6,521,468 B1
(45) Date of Patent: Feb. 18, 2003

(54) LEAD FORMATION, ASSEMBLY STRIP TEST AND SINGULATION METHOD

(75) Inventors: Kong Lam Song, Penang (MY); Peng Cheong Choe, Penang (MY)

(73) Assignee: Integrated Device Technology, Inc., Santa Clara, CA (US)

(*) Notice: Subject to any disclaimer, the term of this patent is extended or adjusted under 35 U.S.C. 154(b) by 0 days.

(21) Appl. No.: 09/953,698

(22) Filed: Sep. 12, 2001

(30) Foreign Application Priority Data

Jul. 25, 2001 (MY) .................................. PI 2001 3529

(51) Int. Cl.$^7$ .......................... H01L 21/66; H01L 21/44
(52) U.S. Cl. .......................... 438/15; 438/111; 438/112
(58) Field of Search .......................... 438/121, 15, 111, 438/112; 257/667, 678

(56) References Cited

U.S. PATENT DOCUMENTS

| | | | | |
|---|---|---|---|---|
| 3,698,076 A | * | 10/1972 | Kingsley | 156/249 |
| 4,139,726 A | * | 2/1979 | Penrod et al. | 174/52.4 |
| 5,173,766 A | * | 12/1992 | Long et al. | 257/668 |
| 5,594,234 A | * | 1/1997 | Carter et al. | 257/666 |
| 5,844,803 A | * | 12/1998 | Beffa | 700/108 |
| 5,909,053 A | * | 6/1999 | Fukase et al. | 257/666 |
| 5,943,558 A | * | 8/1999 | Kim et al. | 438/121 |
| 2001/0041424 A1 | * | 11/2001 | Matsuura et al. | 438/461 |
| 2002/0020929 A1 | * | 2/2002 | Kasuga et al. | 257/787 |
| 2002/0031867 A1 | * | 3/2002 | Horiuchi et al. | 438/125 |
| 2002/0037604 A1 | * | 3/2002 | Lee et al. | 438/112 |

* cited by examiner

*Primary Examiner*—Michael S. Lebentritt
(74) *Attorney, Agent, or Firm*—Bever, Hoffman & Harms, LLP

(57) ABSTRACT

A method for testing integrated circuits (ICs) mounted on an assembly strip after lead formation and before separation from the assembly strip. The ICs are arranged in rows and columns on each assembly strip such that the sides of each IC are connected to leads extending from the assembly strip, and the ends of each IC are held by the assembly strip. The strips are loaded into the system and passed to a first station at which leads are cut and formed while the ends of each IC remain connected to the assembly strip. The assembly strips are then passed to a test apparatus that transmits test signals to the ICs through the formed leads. The IC devices are then separated from the assembly strip using a singulation apparatus, and the separated ICs are stored in tubes for delivery. Visual inspection is also performed at various stages.

20 Claims, 6 Drawing Sheets

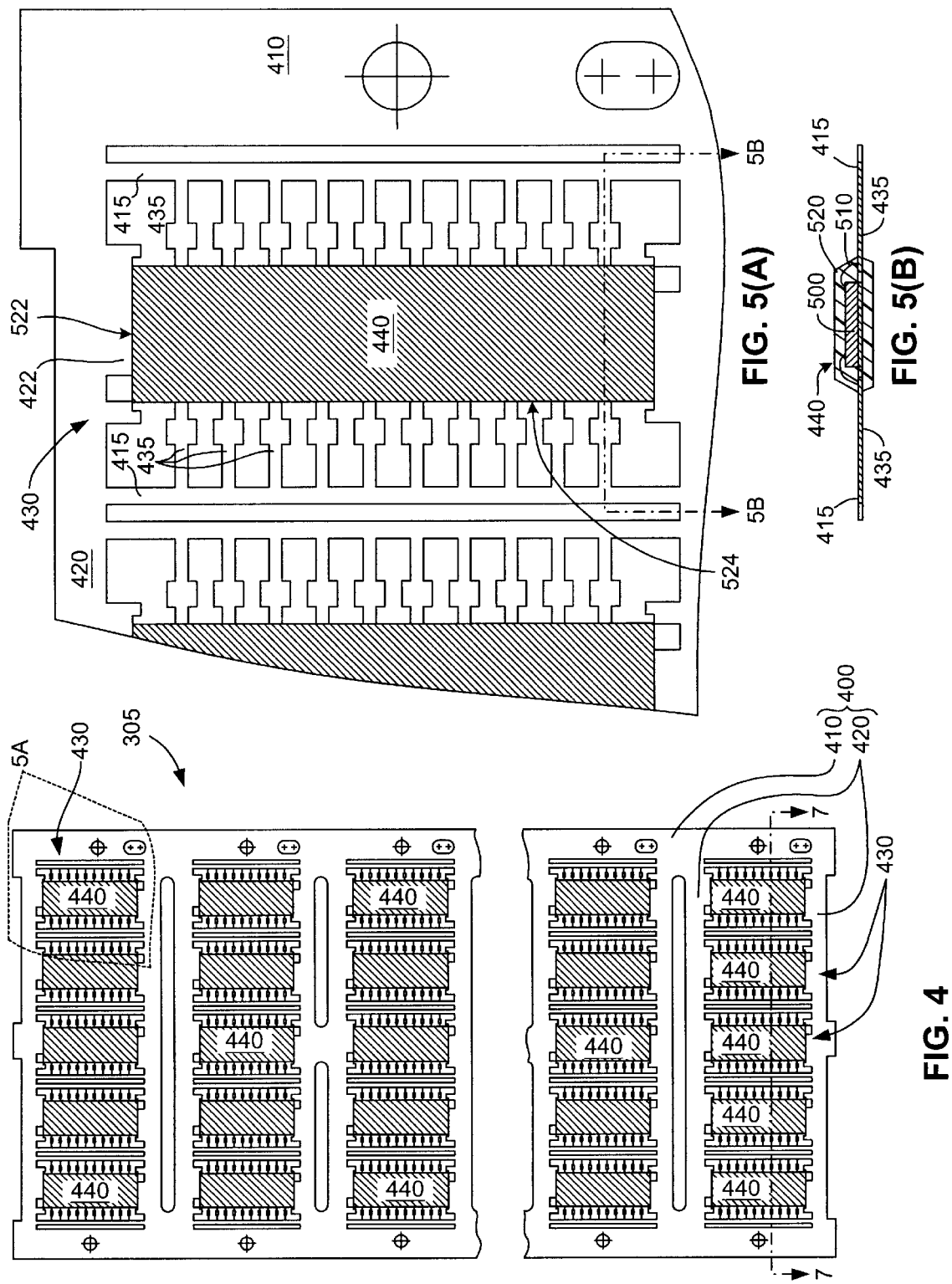

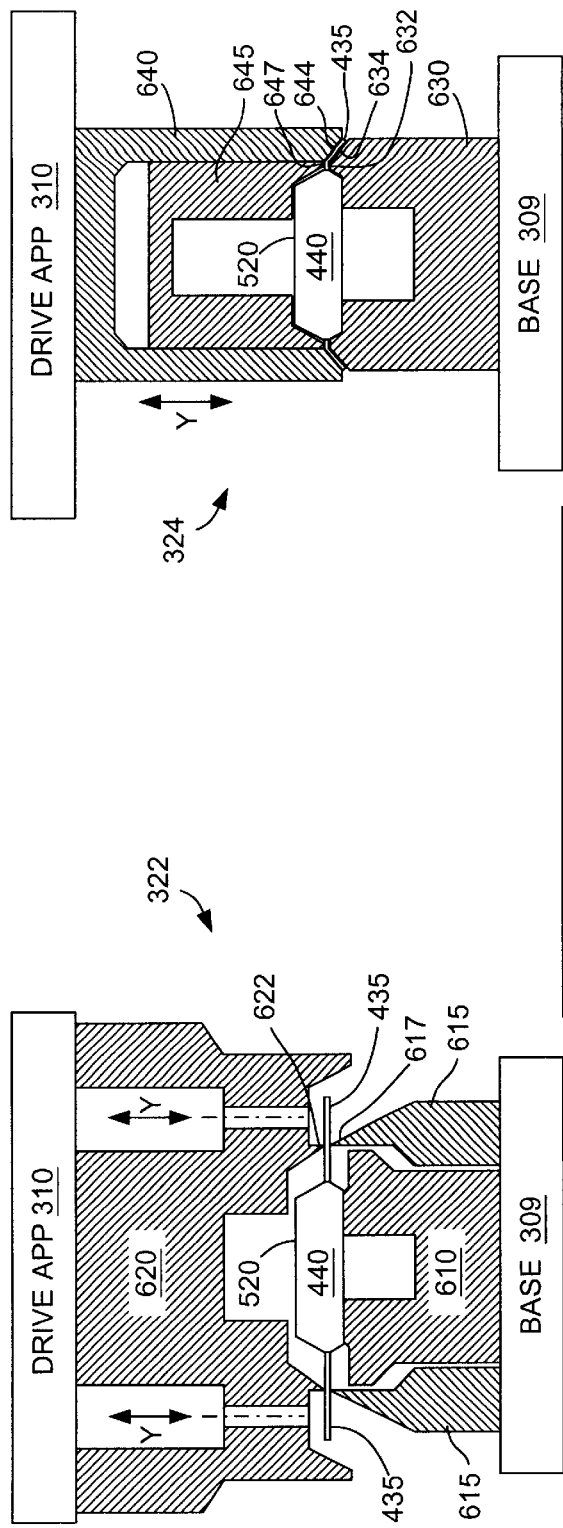
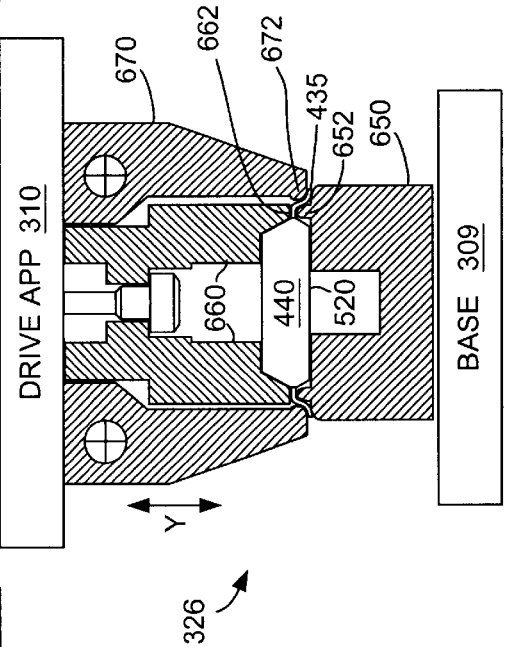

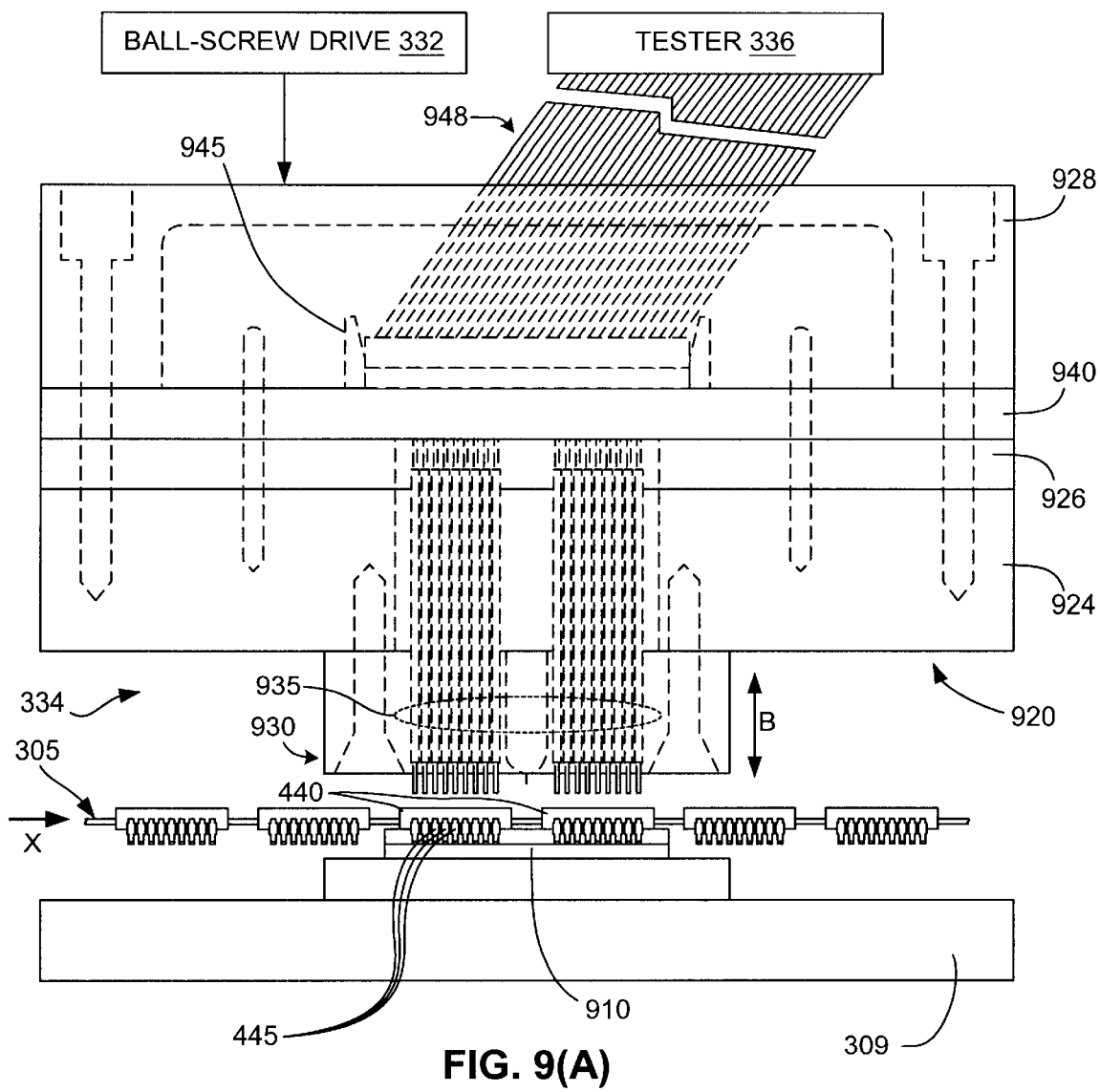
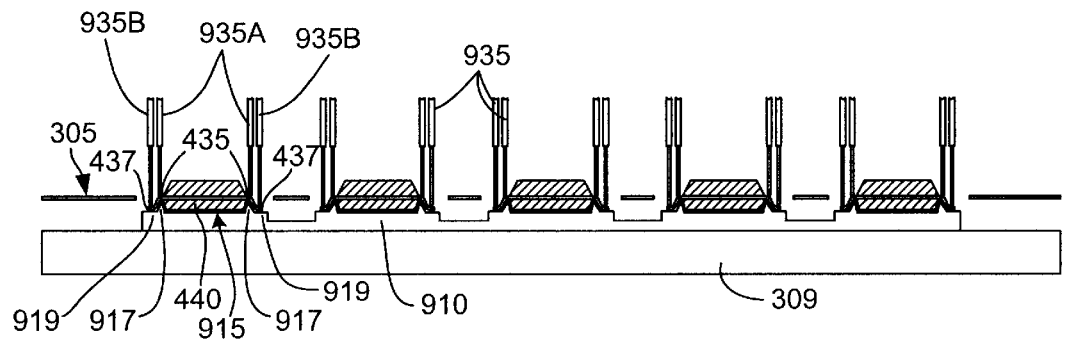

us 6,521,468 B1

LEAD FORMATION, ASSEMBLY STRIP TEST AND SINGULATION METHOD

FIELD OF THE INVENTION

This invention relates to integrated circuits, and more particularly to methods and automated systems for efficiently testing integrated circuits.

BACKGROUND OF THE INVENTION

Molded IC devices are often assembled (packaged) on matrix-type lead frame structures in which the IC devices are arranged in multiple rows and columns, and then tested while connected to the matrix-type lead frame (i.e., before being singulated (separated) into individual IC devices). As utilized herein, the term "assembly strip" is used to describe the integral structure formed by such a matrix-type lead frame structure with IC devices packaged thereon. Assembly strips facilitate low-cost automated production by allowing several IC devices to be tested simultaneously (i.e., in parallel), thereby reducing manufacturing time and costs.

FIGS. 1(A) through 1(C) are perspective views showing a conventional process of assembling IC devices using a lead frame 100, which is simplified for descriptive purposes. Referring to FIG. 1(A), lead frame 100 is etched or stamped from a thin sheet metal strip, and includes side rails 110, cross rails 120, and multiple die attach regions 130. Each die attach region 130 includes a die attach platform 132 connected to side rails 110 by tie bars 135, and patterns of narrow leads 140 that radiate inward from side rails 110 and cross rails 120 toward die attach platform 132. Note that leads 140 do not contact die attach platform 132. During a first stage of the bonding process that is shown in FIG. 1(A), an IC die 150 is mounted onto each die attach platform 132 using, for example, an epoxy resin. A pattern of die bond pads. 152 are provided on an upper surface of IC die 150 that are electrically connected to the integrated circuit formed thereon. As shown in FIG. 1(B), after IC die 150 is secured to die attach platform 132, each die attach platform 152 is :electrically connected to a corresponding lead 140 by a fine-diameter gold bond wire 160 using well-established wire; bond techniques. Subsequently, as indicated in FIG. 1(C), die attach platform 132, the inner ends of leads 140, die 150, and bond wires 160 are covered with a thermoset plastic casing 170 during a transfer molding operation. Note that a portion of each lead 140 is exposed along the sides of casing 170. The integral structure including lead frame 100 and the fully packaged IC device is referred to below as assembly strip 105.

FIGS. 2(A) through 2(C) show a conventional process for functional testing, lead formation, and singulation (i.e., separation of individual IC devices 200 from assembly strip 105), which is performed after the assembly process shown in FIGS. 1(A) through 1(C). First, as shown in FIG. 2(A), the conventional process includes cutting leads 140 such that they are separated from side rails 110 and cross rails 120 of lead frame 100. Note that IC devices 200 remain connected to assembly strip 105 by tie bars 135, and that leads 140 remain flattened (i.e., in plane with side rails 110 and cross rails 120 of lead frame 100). As shown in FIG. 2(B), functional testing is then performed during which test signals are transmitted from a tester 210 to IC devices 200 via probes 215, which are pressed against leads 140 by a suitable mechanism. Note that functional testing is performed while leads 140 are flat (i.e., in the plane defined by lead frame 100). Finally, as indicated in FIG. 2(C), lead forming and singulation is performed to produce individual IC devices 200 having fully formed leads 140. After singulation, lead frame 100 is discarded.

A problem with the conventional testing and singulation process shown in FIGS. 2(A) through 2(C) is that three separate systems are required to perform each of lead cutting (FIG. 2(A)), functional testing (FIG. 2(B)), and singulation (FIG. 2(C)), thereby increasing the total production cost per IC device 200. Further, transferring assembly strips 105 between these separate systems inevitably leads to accidents that damage IC devices 200, further increasing production costs.

What is needed is an efficient and cost effective system and method for performing functional testing, lead formation, and singulation of IC devices that avoids the cost and handling issues associated with the conventional methods described above.

SUMMARY OF THE INVENTION

The present invention is directed to a method for processing and testing ICs mounted on an assembly strip in which both functional and visual lead inspection are performed after cutting and forming the leads, and prior to singulation (i.e., prior to separation of the individual ICs from the assembly strip). Accordingly, the present invention facilitates functional testing, lead formation, and singulation using a single, relatively inexpensive system, thereby reducing overall production costs when compared to conventional methods for performing these procedures. Further, because the assembly strips remain attached to a single system throughout functional testing, lead formation, and singulation, the present invention also minimizes handling by eliminating transfer between independent systems, thereby reducing the costs associated with damage caused during such transfers.

Each assembly strip processed in accordance with the present invention includes multiple rows and columns (e.g., 5×12) of ICs that are mounted on a matrix-type lead frame. In one embodiment, the lead frame includes IC mounting regions made up of a die attach platform that is connected at opposite ends to the lead frame, and parallel leads extending from opposing sides of the die attach platform to lead tie bars of the lead frame. An IC is mounted on each die attach platform and connected (e.g., using wire bonding techniques) to the leads located adjacent to the die attach platform. Subsequently, packaging material (e.g., thermoset plastic) is formed over the IC, bonding wires and die attach platform.

In accordance with a disclosed embodiment of the present invention, a method for processing ICs mounted on assembly strips utilizes a lead length cut/form apparatus, a functional test apparatus, and a singulation apparatus. After the IC dies are mounted on the assembly strip, they are loaded into magazines and systematically moved by an onloader to a conveyor, which moves the assembly strips to the lead length cut/form apparatus. The lead length cut/form apparatus cuts the leads connected to the package of each IC, preforms (i.e., bends) the leads, and forms the leads into a desired final form without separating the ICs from the assembly strip. The assembly strips are then passed to the functional test module in which probes (e.g., pogo pins) are pressed against the fully formed leads and functional tests are transmitted to the ICs from a tester. Visual inspection of the leads is then performed to identify defective leads, e.g., damaged leads, bent leads, or missing leads. After functional and visual testing, the assembly strips are passed to a singulation apparatus that separates the ICs from the assembly strip frame, and to an offloader that loads the separated ICs into storage tubes. An optional second visual inspection may be performed after singulation and prior to loading to detect package defects that may have occurred during the testing and singulation operations, or during preceding processes.

In accordance with an aspect of the present invention, the lead cut/form process and singulation process are performed using a single drive apparatus, thereby reducing costs by eliminating the need for separate drive mechanisms for these two operations. Note that the functional testing process, which is performed between the lead length cut/form and singulation processes, is provided with a separate ball-screw drive that facilitates testing of the ICs. A conveyor is utilized to automatically pass each assembly strip from the lead length cut/form process to the functional test process, and from the functional test process to the singulation process, thereby minimizing IC damage caused by transporting the assembly strips between separate systems.

In accordance with another aspect of the present invention, functional testing is performed using a stationary anvil and a probe assembly that is moved toward and away from the anvil by the ball-screw drive. The anvil includes a trough and a pair of rails that hold the IC devices during testing. The probe assembly includes probes (e.g., pogo pins) that are pressed against the leads of the IC devices, which are supported by the rails to prevent damage. The probes are arranged to include a first set positioned to contact a portion of the leads located on top of the rails when the probe assembly is initially moved toward the anvil, and a second set positioned to contact the feet of the leads when the probe assembly is moved further toward the anvil. Accordingly, the functional testing module facilitates functional testing while preventing damage to the leads, thereby reducing the number of systems needed to perform the testing and singulation process.

BRIEF DESCRIPTION OF THE DRAWINGS

These and other features, aspects and advantages of the present invention will become better understood with regard to the following description, appended claims, and accompanying drawings, where:

FIG. 4 is partial plan view showing an exemplary assembly strip utilized in accordance with an embodiment of the present invention;

FIGS. 5(A) and 5(B) are plan and side section views showing an IC device mounted on the assembly strip of FIG. 4;

FIGS. 6(A), 6(B), and 6(C) are simplified cross-sectional side views showing portions of a lead length cut/form apparatus of the system shown in FIG. 3;

FIGS. 9(A) and 9(B) are side and partial front views, respectively, showing a functional test apparatus utilized in the system of FIG. 3.

DETAILED DESCRIPTION OF THE DRAWINGS

Figures 3, 3A:
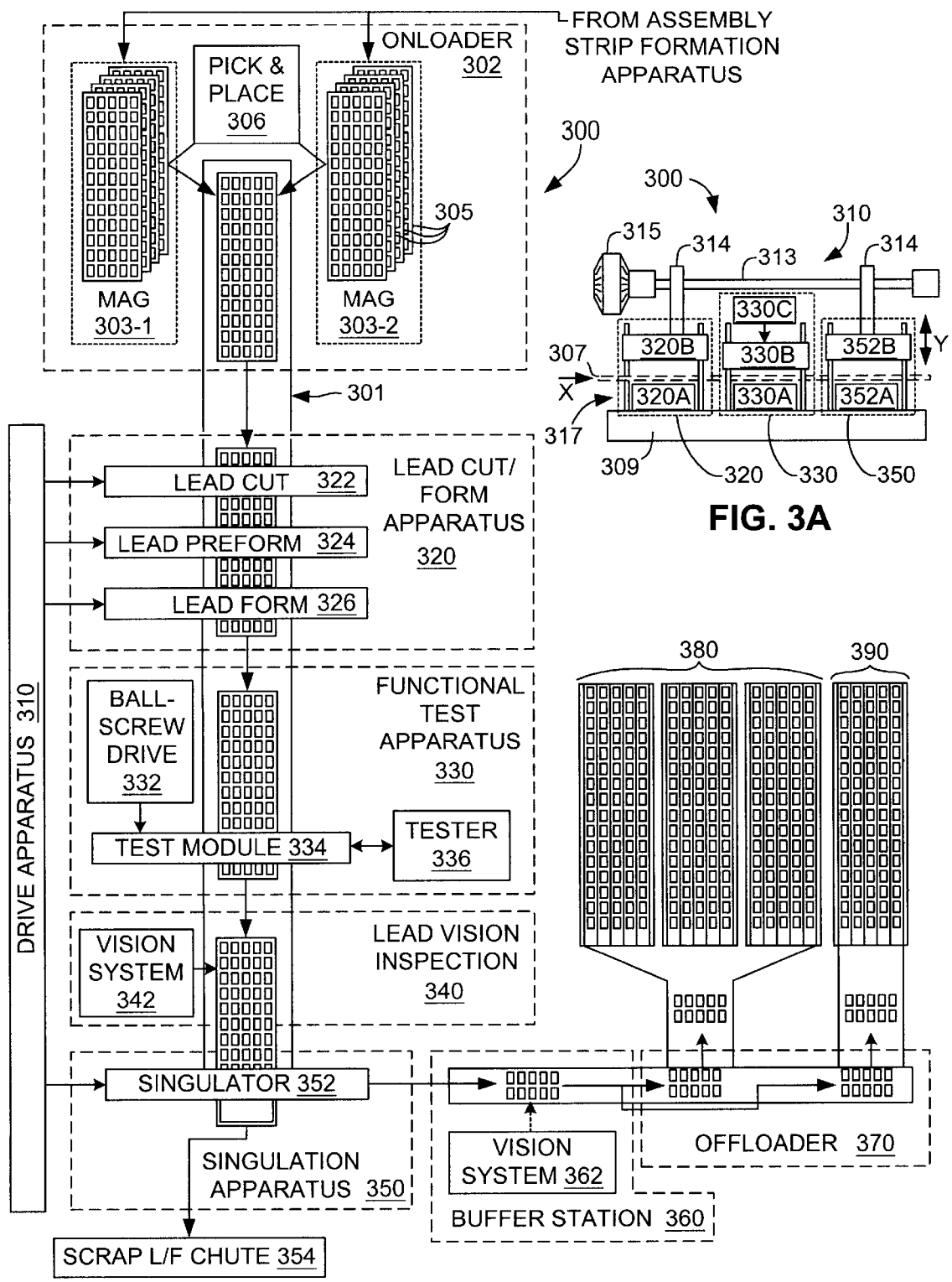
FIG. 3 is a block diagram showing a system for IC device lead formation, functional test, and singulation according to an embodiment of the present invention.
FIG. 3A is a simplified side view depicting a portion of the system shown in FIG. 3.

FIG. 3 is a block diagram showing a system 300 for processing and testing integrated circuits (ICs) that are mounted on assembly strips 305. System 300 generally includes a conveyor mechanism (workholder) 301, a drive apparatus 310, a lead length cut/form apparatus 320, a functional test apparatus 330, and a singulation apparatus 350.

Conveyor 301 transports assembly strips 305 to lead length cut/form apparatus 320, from lead length cut/form apparatus 320 to functional test apparatus 330, and from functional test apparatus 330 to singulation apparatus 350. Note that conveyor 301 may be separated into segments that feed into each of the apparatus, or may be formed using a continuous belt. A system controller (not shown) controls the speed and position of conveyor 301.

FIG. 3A is a simplified side view depicting selected functional aspects of system 300. As indicated in FIG. 3A, conveyor 301 is mounted on a base 309 that supports each of lead length cut/form apparatus 320, functional test apparatus 330, and singulation apparatus 350, and feeds assembly frames through system 300 (e.g., in a horizontal direction indicated by the X arrow). Drive apparatus 310 is mounted over base 309, and includes a motor 315 for turning a cam mechanism (depicted as including a shaft 313 and cam wheels 314) that is utilized to operate both functional test apparatus 330 and singulation apparatus 350. In particular, lead length cut/form apparatus 320 includes a stationary (first) portion 320A rigidly mounted on base 309, and a movable (second) portion 320B that is reciprocated toward and away from stationary portion 320A (i.e., in the vertical direction indicated by arrow Y) through contact with the cam mechanism of drive apparatus 310 when the cam mechanism is turned by motor 315. Similarly, singulation apparatus 350 includes a stationary (first) portion 350A mounted on base 309, and a movable (second) portion 350B contacting the cam mechanism of drive apparatus 310 such that movable portion 350B is reciprocated toward and away from stationary portion 350A when the cam mechanism is turned. Functional test apparatus 330, which is located between lead length cut/form apparatus 320 and singulation apparatus 350, includes a stationary (first) portion 330A mounted on base 309, and a movable (second) portion 330B mounted over stationary portion 330A. Note that movable portion 330B is reciprocated toward and away from stationary portion 330A by a separate drive 330C to facilitate IC testing procedures.

FIGS. 4, 5(A) and 5(B) show assembly strip 305 in additional detail.

FIG. 4 is a partial view showing opposing ends of exemplary assembly strip 305. Assembly strip 305 includes a matrix-type lead frame 400 including side rails 410 and cross rails 420, and includes several rows of IC mounting regions 430 located between cross rails 420, each mounting region 430 including one IC device 440 mounted thereon. In one embodiment, each row includes five (5) mounting regions 430, and assembly strip 305 includes twelve (12) columns.

Figure 1A:
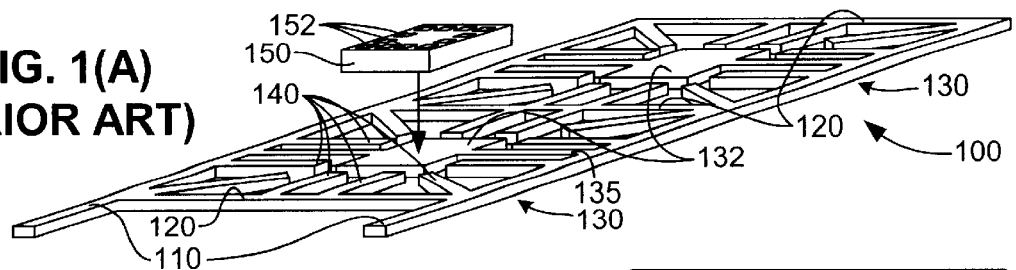
FIGS. 1(A), 1(B), and 1(C), are perspective views showing a conventional IC device assembly process.
Figure 1B:
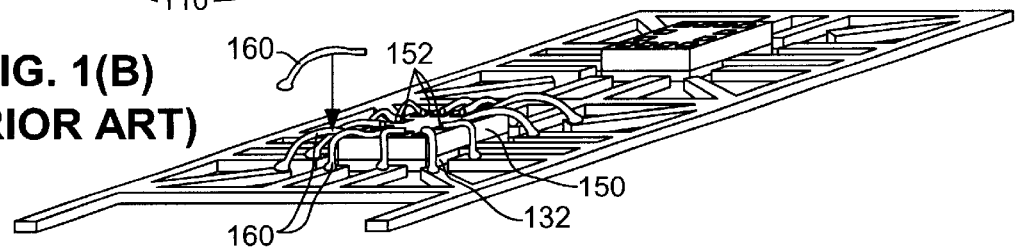
Figure 1C:
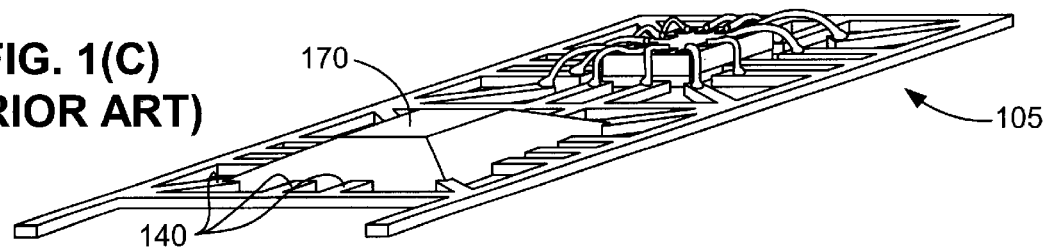
Figure 2A:
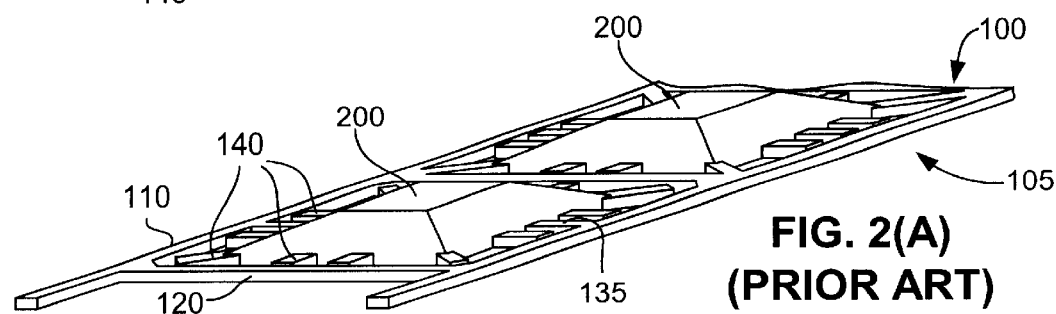
FIGS. 2(A), 2(B), and 2(C) are perspective views showing a conventional process for functional testing, lead formation, and singulation of IC devices using an assembly strip.
Figure 2B:
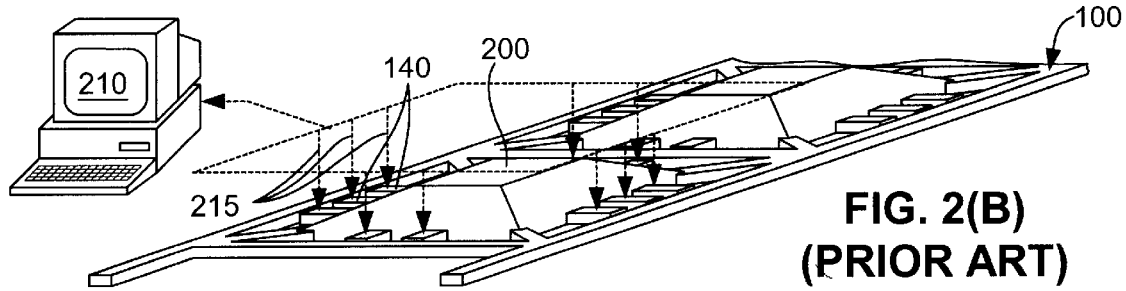
Figure 2C:
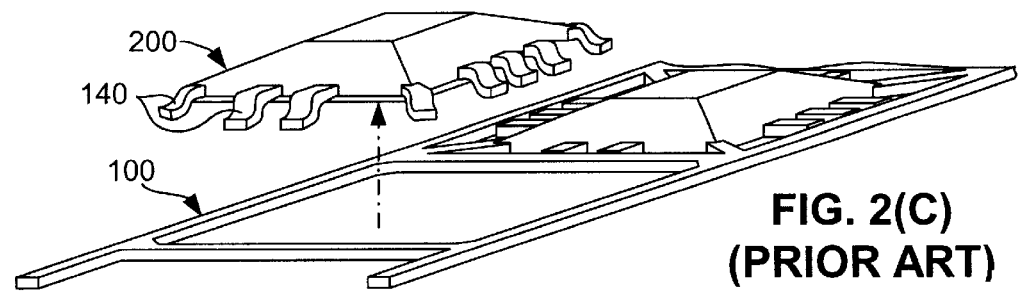

FIGS. 5(A) and 5(B) are plan and cross-sectional side views, respectively, showing one mounting region 430 in additional detail. Referring to FIG. 5(B), each IC device 440 includes a die 500 mounted on a die attach platform 432, with die 500 being is electrically connected to leads 435 by bond wires 510. A thermoplastic IC package 520 is formed over die 500, bond wires 510, and ends of leads 435 using techniques described above with reference to FIGS. 1(A) through 1(C). Referring to FIG. 5(A), each IC device 440 is mounted and packaged such that ends 522 of each IC package 520 are secured to connection structures 422 of cross rails 420 by tie bars (not shown). Similarly, leads 435 extend between sides 524 of each IC package 522 and lead tie bars 415 of assembly strip 305. Note that when assembly strip 305 is formed (i.e., by stamping or etching a metal sheet according to known methods), leads 435 are integrally connected to lead tie bars 415.

Referring back to FIG. 3, in one embodiment assembly strips 305 are introduced into system 300 using a loading apparatus (ONLOADER) 302. In one embodiment, onloader 302 includes a first magazine (MAG) 303-1 and a second magazine 303-2 that respectively store multiple assembly strips 305, and a pick-and-place mechanism 306 for moving assembly strips 305 from magazines 303-1 and 303-2 onto conveyor 301 using known techniques. From onloader 302, conveyor 301 transfers assembly strips 305 to cut/form apparatus 320, functional test apparatus 330, and singulation apparatus 350, respectively, for processing in the order described below.

Referring to center-left region of FIG. 3, according to an embodiment of the present invention, lead length cut/form apparatus 320 includes a lead length cut mechanism 322, a lead preform mechanism 324, and a lead form mechanism 326. Lead length cut mechanism 322, lead preform mechanism 324, and lead form mechanism 326 include movable portions that are reciprocated by drive apparatus 310, and are successively arranged along the path of conveyor 301 such that leads 435 (see FIG. 5(A)) of each assembly strip 305 are successively cut, preformed, and formed in the manner described below.

FIGS. 6(A), 6(B), and 6(C) are simplified cross-sectional side views showing representative portions of lead length cut mechanism 322, lead preform mechanism 324, and lead form mechanism 326, respectively, in additional detail. In one embodiment, each mechanism is formed as a separate unit mounted on base 309. Those of ordinary skill in the art will recognize that two or more of these mechanisms may be combined to perform the cutting, preforming, and forming processes using less than three separate mechanisms. Further, additional mechanisms may be added to facilitate a more gradual lead forming process.

Referring to FIG. 6(A), lead length cut mechanism 322 includes an anvil 610, a lead length cut die 615, and a lead length cut punch 620. Anvil 610 is mounted on base 309 and supports package 520 of IC device 440 during the lead length cutting process. Lead length cut die 615 is also mounted on base 309, and includes upper edges 617 that support leads 435, and serve as one part of the lead cutting mechanism. Lead length cut punch 620 is movably mounted over anvil 610, and is connected to the cam mechanism of drive apparatus 310 such that it reciprocates in vertical direction (indicated by the two-headed arrow Y). Lead length cut punch 620 includes lower edges 622 that serve as the second part of the lead cutting mechanism. During the lead length cutting process, the assembly strip is moved such that IC device 440 is located between anvil 620 and lead length cutting punch 620 (i.e., the assembly strip is moved perpendicular to the page), and then punch 620 is moved downward (toward die 615) to sever the end of each lead 435. Punch 620 is then moved upward, and the assembly strip is moved to position another IC device for the lead length cutting process.

FIG. 6(B) shows lead preform mechanism 324, which includes a lower (first) anvil 630, a lead preform punch 640, and an upper (second) anvil 645. Lower anvil 630 is mounted on base 309 and supports package 520 of IC device 440 during the lead preforming process. Lower anvil 630 also includes shoulders 632 that support a portion of leads 435 located adjacent to package 520, and chamfered surfaces 634 that have, for example, a 45 downward slope relative to the plane defined by the assembly strip. Lead preform punch 640 is movably mounted over anvil 610, and is connected to the cam mechanism of drive apparatus 310 such that it reciprocates in vertical direction. Lead preform punch 640 includes lower chamfered surfaces 644 that have the same slope as chamfered surfaces 632 formed on lower anvil 630, and are positioned directly over chamfered surfaces 632. Upper anvil 645 is slidably mounted on preform punch 640, and includes shoulders 647 that cooperates with shoulders 632 of lower anvil 630 to support the portion of leads 435 located near package 520 during the preform process. During the lead preform process, the assembly strip is moved such that IC device 440 is located between lower anvil 630 and lead length cutting punch 640 (i.e., perpendicular to the page), and then punch 640 is moved downward (toward lower anvil 630). First, shoulders 647 of upper anvil 645 contact the portions of leads 435 located adjacent to package 520 (i.e., these lead portions are pinched between shoulders 632 and shoulders 647). Next, preform punch 640 moves downward to bend leads 435 at a 45 angle between chamfered surface 634 and chamfered surface 644. Punch 640 is then moved upward, and the assembly strip is moved to position another IC device for the lead preform process.

FIG. 6(C) shows lead forming mechanism 326, which includes a lower (first) anvil 650, an upper (second) anvil 660, and a cam portion 670. Lower anvil 650 is mounted on base 309 and includes a trough that receives and supports package 520 of IC device 440 during the lead forming process. Lower anvil 650 also includes a pair of rails 652 that supports a portion of leads 435 located adjacent to package 520. Upper anvil 660 is movably mounted over anvil 610, and is connected to the cam mechanism of drive apparatus 310 such that it reciprocates in vertical direction, and includes shoulders 662 that cooperates with rails 652 to hold portions of leads 435 located near package 520 during the lead forming process. Cam portion 670 is rotatably connected to upper anvil 660, and includes a cam form pad 672 that contacts and bends the free ends of leads 435 during the lead forming process to form feet at the free ends. During the lead forming process, the assembly strip is moved such that IC device 440 is located between lower anvil 650 and upper anvil 660, and then upper anvil 660 is moved downward. First, shoulders 662 of upper anvil 660 contact the portions of leads 435 located adjacent to package 520 (i.e., these lead portions are pinched between shoulders 662 and rails 652). Next, cam portion 670 rotates inward such that cam form pads 672 press leads 435 against rails 652, thereby bending leads 435 between cam form pads 672 and rails 652 to form feet. Upper anvil 660 and cam portion 670 are then moved upward, and the assembly strip is moved to position another IC device for the lead forming process.

Figure 7A:
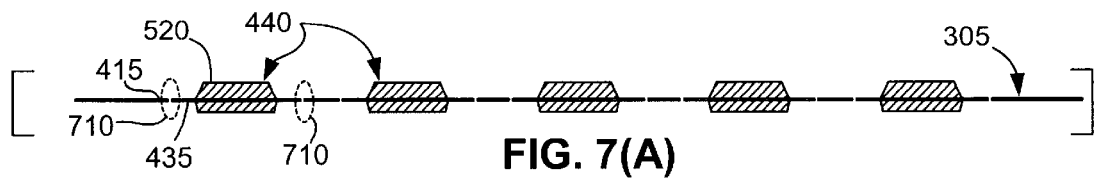
FIGS. 7(A), 7(B) and 7(C) are end views showing the assembly strip of FIG. 4 showing the lead length cut/form process.
Figure 7B:
Figure 7C:

FIGS. 7(A), 7(B) and 7(C) are end views showing assembly strip 305 as it is processed by lead length cut/form apparatus 320 (shown in FIG. 3). Note that each of lead length cut mechanism 322, lead preform mechanism 324, and lead form mechanism 326, which are described above with reference to FIGS. 6(A) through 6(C), include multiple processing sites for cutting, preforming, or forming the leads of one or more rows of IC devices simultaneously. Specifically, as shown in FIG. 7(A), leads 435 of one row of IC devices 440 are cut by lead length cut mechanism 322 (FIG. 6(A)) at a point adjacent to lead tie bars 415 (i.e., such that each lead 435 becomes a cantilever structure with a fixed end supported by IC package 520). Next, as shown in FIG. 7(B), leads 435 are bent downward relative to package 520 (i.e., out of plane Pi defined by assembly strip 305) by lead preform mechanism 324 (FIG. 6(B)) at an angle of approximately 45. Finally, as shown in FIG. 7(C), the free ends of leads 435 are bent by lead form mechanism 326 (FIG. 6(C)) to form feet 437 that define a second plane P2 located below plane P1. Because all three procedures shown in FIGS. 7(A) through 7(C) (i.e., lead cut, lead preform, and lead form) are performed by apparatus 320 before functional testing, total manufacturing costs are reduced because separate lead cutting and lead forming apparatus are not required. That is, total cost is reduced because each of lead length cut mechanism 322, lead preform mechanism 324, and lead form mechanism 326 are driven by a single mechanism (i.e., drive apparatus 310), instead of two or more drive mechanisms that are required using conventional methods. Further, because lead length cut mechanism 322, lead preform mechanism 324, and lead form mechanism 326 are linked by conveyor 301 such that assembly strips 305 are automatically transferred between these mechanisms, damage to leads 435 that can occur during transportation between two separate systems is also avoided, further reducing total production costs.

Figure 8:
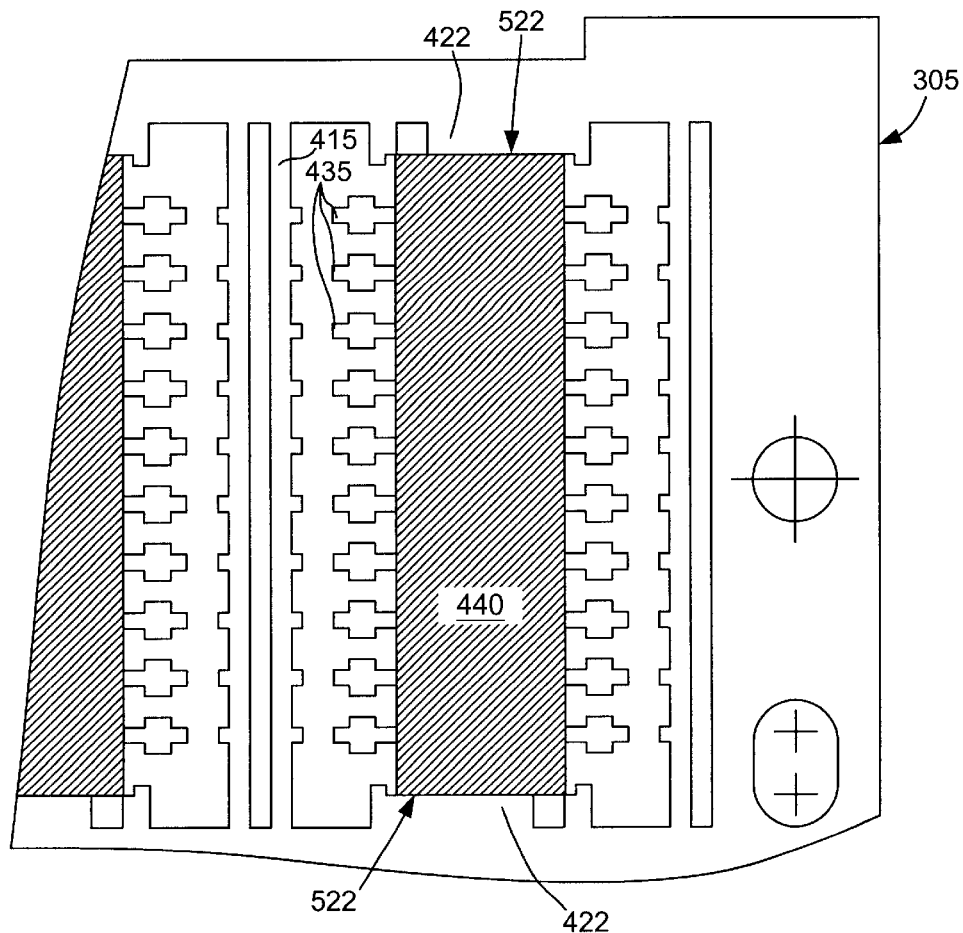
FIG. 8 is a plan view showing an exemplary IC device after lead formation is completed.

FIG. 8 is an enlarged plan view showing IC 440 after the cut/form procedure performed by apparatus 320 is completed. Note that leads 435 are separated from lead tie bars 415, but ends 522 of IC device 440 remains connected to connection structures 422 of assembly strip 305. Accordingly, IC devices 440 remain fixedly connected to assembly strip 305 throughout the lead cutting and forming process, thereby facilitating automated testing (described below).

Returning to FIG. 3, after lead formation, assembly strips 305 are then passed via conveyor 301 to functional test apparatus 330. Functional test apparatus 330 includes a separate ball-screw drive 332, a test module 334, and tester (e.g., a computer or workstation) 336.

FIGS. 9(A) and 9(B) are side and partial front views showing functional test apparatus 330 in additional detail.

Referring to FIG. 9(A), functional test apparatus 330 includes an anvil 910 that is mounted on base 309. Mounted over anvil 910 is a probe assembly 920, which includes a lower plate 924 that supports a probe array 930. Mounted above lower plate 924 is a non-conductive intermediate plate 926 and a non-conductive top plate 928. Sandwiched between intermediate plate 926 and top plate 928 is a printed circuit board (PCB) 940 including a socket 945 from which a cable 948 extends between PCB 940 and tester 336. Probe array 930 extends from a lower surface of lower plate 924, and includes probes (e.g., dual spring pogo pins) 935 having one end extending toward anvil 910, and a second end pressed against corresponding contact pads (not shown) formed on a lower surface of PCB 940.

Referring to FIG. 9(B), anvil 917 includes several troughs 915 and pairs of rails 917, each pair of rails 917 being located along the outside edges of an associated trough 915. Troughs 915 are shaped to receive and support the lower package body of IC devices 440, and rails 917 are shaped to support a portion of leads 435 located adjacent to the package body during functional testing, which is described below. Note that the bent portion of leads 435 (i.e., including feet 437) extend over rails 917 such that feet 437 are positioned over lands 919.

During operation, conveyor 301 (shown in FIG. 3) pushes assembly strip 305 in the X direction such that a group of IC devices 440 are positioned on anvil 917 with leads 435 located under probes 935. The ball-screw drive 332 moves probe assembly 920 downward towards anvil 910 such that the ends of probes 935 contact leads 435. Once the probe assembly is fully lowered, the system controller sends a "start test" signal to the tester 336 to initiate the functional test. As indicated in FIG. 9(B), in one embodiment, probes 935 include a first set 935A which contacts an upper portion of leads 435 (i.e., adjacent the package body), and a second set 935B that subsequently contacts feet 437. Because first probe set 935 contacts leads 435 adjacent to the package body, IC devices 440 are securely held in position before second probe set 935B contacts feet 437. Note that first probe set 935A serves both to hold IC devices 440 during testing, and to provide enhanced electrical connection between the tester (not shown) and IC devices 440. Accordingly, functional test apparatus 330 facilitates testing IC devices 440 after leads 435 are fully formed, and with minimal risk of damaging or bending leads 435. Test, signals are then transmitted to and from tester 336 via cable 948, socket 945, PCB 940, and probes 935 to leads 435. As discussed above, leads 435 are connected, for example, by bond wires to the IC die packaged therein, thereby facilitating functional testing of the IC die. An optional marking system (not shown) may be used to mark IC devices 440 that fail functional testing. Upon completing functional testing of the group of IC devices 440, tester 336 sends an "end of test" signal to the system controller. Ball-screw drive 332 then raises probe assembly 920, and the conveyor pushes assembly strip 305 to position a new group of IC devices 440 under probes 935. This functional testing process is then-repeated until all IC devices 440 on assembly strip 305 are tested.

Note that functional test apparatus 330 is described above as testing groups of ten IC devices 440 (i.e., in a so-called "2 UP X 5" arrangement). Accordingly, multiple IC devices 440 are tested simultaneously, thereby minimizing overall production costs. Of course, other arrangements may be utilized to test a different number or pattern of IC devices.

Returning to FIG. 3, upon leaving functional test apparatus 330, assembly strips 305 pass through an optional lead vision inspection station 340 including a first vision system 342 that checks the leads of each IC device 440 using known techniques. In particular, vision system 342 checks for damaged leads, bent leads, missing leads, or short leads.

After lead vision inspection, assembly strips 305 are passed to singulation apparatus 350. In one embodiment, singulation apparatus 350 utilizes standard equipment that includes an anvil and a singulation die mounted on the system base, and a stripper and a punch movably mounted over the anvil and connected to the cam mechanism of drive apparatus 310 (see FIG. 3A). Similar to structures described above, the anvil includes a package support, and the singulation die supports the rails of the assembly strip. After positioning the assembly strip, the stripper is moved downward against the rails, and the punch then pushes the package downward. Referring to FIG. 8, this downward force breaks the tie bars (not shown) connecting ends 522 of each IC device 440 to connecting structures 422 of assembly strip 305, thereby separating IC device 440 from assembly strip 305. Referring to FIG. 3, separated lead frames are passed into a scrape lead frame (L/F) chute 352, and the separated IC devices 440 are passed to a buffer station 360.

Buffer station 360 includes a second vision system 362 that performs an automated inspection of each IC device 440 using known techniques. In particular, vision system 362 checks each IC device 440 for package surface damage, voids, and device markings. Buffer station 360 then segregates the IC devices for manipulation by an offloading mechanism 370. In particular, buffer station 360 routes the "good" IC devices to a chute feeding into a first set of storage tubes 380. Alternatively, buffer station 360 routes "bad" IC devices (i.e., rejects from functional test, vision system 342, or vision system 362) to a chute feeding into a second set of storage tubes 390.

Although the present invention has been described with respect to certain specific embodiments, it will be clear to those skilled in the art that the inventive features of the present invention are applicable to other embodiments as well, all of which are intended to fall within the scope of the present invention.

What is claimed is:

1. An assembly strip test method for testing integrated circuits mounted on a matrix-type lead frame defining a plane, the method comprising:

cutting and forming leads of the integrated circuits such that the leads are bent out of the plane defined by lead frame, wherein the integrated circuits remain connected to the lead frame after the leads are formed;

performing functional testing on the integrated circuits by transmitting test signals onto the formed leads of the integrated circuits; and separating, the tested integrated circuits from the lead frame.

2. The method according to claim 1, further comprising:

moving the lead frame on a conveyor from a first apparatus for cutting and forming the leads to a second apparatus for function testing the integrated circuits; and moving the, lead frame on the conveyor from the second apparatus to a third apparatus for separating the integrated circuits from the lead frame.

3. The method according to claim 1, further comprising automatically inspecting the leads of the integrated circuits after performing functional testing and before separating the integrated circuits from the lead frame.

4. The method according to claim 1, wherein cutting and forming the leads comprises cutting the leads using a first mechanism, preforming the leads using a second mechanism, and then forming the leads into a final form using a third mechanism.

5. The method according to claim 4, wherein cutting the leads comprises supporting a package body of the integrated circuit and positioning the leads of the integrated circuit between a stationary die and a movable punch, and then moving the movable punch toward the stationary die, and wherein the stationary die includes a first edge, and the movable punch includes a second edge positioned over the first edge such that the first and second edges cut the leads when the movable punch is moved toward the stationary die.

6. The method according to claim 4, wherein preforming the leads comprises supporting a package body of the integrated circuit and positioning the leads of the integrated circuit between a stationary anvil and a movable structure including a preform punch and a second anvil slidably mounted on the preform punch, and moving the movable structure toward the stationary anvil, wherein the first anvil includes a first shoulder for supporting the leads, and the second anvil includes a second shoulder positioned such that portions of the leads located adjacent to a package of the integrated circuit are held between the first and second shoulders when the second anvil is moved toward the first anvil, and wherein the first anvil includes a first chamfered surface, and the preform punch includes a second chamfered surface arranged such that the leads are bent between the first and second chamfered surfaces when the preform punch is moved toward the first anvil.

7. The method according to claim 4, wherein the forming the leads into the final form comprises supporting a package body of the integrated circuit and positioning the leads of the integrated circuit between a stationary anvil and a movable structure including a second anvil and a lead forming portion rotatably connected to the second anvil, and moving the movable structure toward the stationary anvil, wherein the first anvil includes a rail for supporting the leads, and the second anvil includes a shoulder positioned such that portions of the leads located adjacent to a package of the integrated circuit are pinched between the rail and the shoulder when the second anvil is moved toward the first anvil, and wherein the lead forming portion includes a cam form pad arranged such that the leads are formed between the cam form pad and the rail when the lead forming portion is rotated relative to the second anvil.

8. The method according to claim 1, further comprising automatically moving the matrix-type lead frame from a first apparatus for cutting and forming the leads of the integrated circuits to a second apparatus for performing functional testing using a conveyor.

9. The method according to claim 8, wherein functional testing the integrated circuits comprises:

moving the matrix-type lead frame such that one or more integrated circuits are positioned between a stationary anvil and a movable probe assembly;

moving the movable probe assembly toward the stationary anvil, wherein the probe assembly includes a probe array having a plurality of probes arranged such that the probes contact the leads when the probe assembly is moved toward the anvil by the ball-screw drive; and transmitting test signals to the probes.

10. The method according to claim 9, wherein moving the movable probe assembly comprises contacting a base portion of each lead located adjacent to a package of the integrated circuit using a first set of probes when the probe assembly is moved a first distance toward the anvil, and contacting a foot of each lead using a second set of probes when the probe assembly is moved a second distance toward the anvil.

11. The method according to claim 1, further comprising automatically moving the matrix-type lead frame from a first apparatus for functional testing the integrated circuits to a second apparatus for separating the tested integrated circuits from the lead frame using a conveyor.

12. The method according to claim 11, wherein separating the integrated circuits comprises positioning one or more integrated circuits between a stationary anvil and a movable structure including a stripper and a punch, and then moving the movable structure toward the stationary anvil such that the stripper pinches a leadframe of the assembly strip against the stationary anvil, and the punch pushes the integrated circuit such that the integrated circuit is separated from the leadframe when the stripper and punch are moved toward the anvil.

13. A method for testing integrated circuits formed on an assembly strip, the assembly strip including a leadframe defining a plane and a plurality of integrated circuits mounted on the lead frame, each integrated circuit being electrically connected to a plurality of leads extending between the integrated circuit and the leadframe, the method comprising:

cutting and forming the leads of each integrated circuit such that the leads are bent away of the plane defined by the assembly strip;

functional testing the integrated circuits using a plurality of probes that are arranged to contact the cut and formed leads; and separating the tested integrated circuits from the lead frame.

14. The method according to claim 13, further comprising automatically moving the lead frame from a first apparatus for cutting and forming the leads of the integrated circuits to a second apparatus for performing functional testing using a conveyor.

15. The method according to claim 13, wherein cutting and forming the leads comprises cutting the leads using a first mechanism, preforming the leads using a second mechanism, and then forming the leads into a final form using a third mechanism.

16. The method according to claim 15, further comprising driving the first, second, and third mechanisms using a single drive apparatus.

17. The method according to claim 13, further comprising automatically moving the matrix-type lead frame from a first apparatus for functional testing the integrated circuits to a second apparatus for separating the tested integrated circuits from the lead frame using a conveyor.

18. A method for testing integrated circuits formed on an assembly strip, the assembly strip including a lead frame defining a plane and a plurality of integrated circuits connected to the lead frame, each integrated circuit including a package body housing an integrated circuit chip that is electrically coupled to a plurality of leads extending from the package body, the method comprising:

forming the leads such that portions of the leads are bent out of the plane defined by the lead frame;

functional testing the integrated circuits by moving the lead frame such that one or more integrated circuits are positioned between a stationary anvil and a movable probe assembly, moving the movable probe assembly toward the stationary anvil, and transmitting test signals to the probe assembly; and separating the tested integrated circuits from the lead frame, wherein the probe assembly includes a probe array having a plurality of probes arranged such that the probes contact the leads when the probe assembly is moved toward the anvil.

19. The method according to claim 18, wherein moving the movable probe assembly comprises contacting a base portion of each lead located adjacent to a package of the integrated circuit using a first set of probes when the probe assembly is moved a first distance toward the anvil, and contacting a foot of each lead using a second set of probes when the probe assembly is moved a second distance toward the anvil.

20. The method according to claim 18, further comprising automatically moving the lead frame from a first apparatus for cutting and forming the leads of the integrated circuits to a second apparatus for performing functional testing using a conveyor.

* * * * *